United States Patent [19]

Tanaka et al.

[11] 4,443,711
[45] Apr. 17, 1984

[54] ELECTRET DEVICE

[75] Inventors: Masamichi Tanaka, Yamato; Hiroto Wada, Yokosuka, both of Japan

[73] Assignee: Tokyo Shibaura Denki Kabushiki Kaisha, Tokyo, Japan

[21] Appl. No.: 500,831

[22] Filed: Jun. 3, 1983

Related U.S. Application Data

[63] Continuation of Ser. No. 280,016, Jun. 30, 1981, abandoned.

[30] Foreign Application Priority Data

Jun. 30, 1980 [JP] Japan .................................. 55-88781
Jun. 30, 1980 [JP] Japan .................................. 55-88821
Jun. 30, 1980 [JP] Japan .................................. 55-88822
Jun. 30, 1980 [JP] Japan .................................. 55-88823

[51] Int. Cl.³ ............................................. G11C 13/02
[52] U.S. Cl. ................................................. 307/400
[58] Field of Search ........................ 307/400; 365/146; 29/592 E; 361/233

[56] References Cited

U.S. PATENT DOCUMENTS 3,967,027 6/1976 Igarashi ............................... 307/400
4,250,415 2/1981 Lewiner et al. ..................... 307/400

FOREIGN PATENT DOCUMENTS 2079054A 1/1982 United Kingdom ................ 307/400

Primary Examiner—James W. Moffitt
Attorney, Agent, or Firm—Finnegan, Henderson, Farabow, Garrett & Dunner

[57] ABSTRACT

An electret device having an improved surface charge in terms of high potential and uniformity of charge distribution. The electret device comprises negative and positive electret elements which are stacked upon each other in layers. Each electret element comprises a dielectric layer and a conductive layer. At least one outer end of the electret device is secured to a conductive electrode by a conductive layer of the electret element or a conductive outer plate stacked on the dielectric layer of an electret element.

7 Claims, 5 Drawing Figures

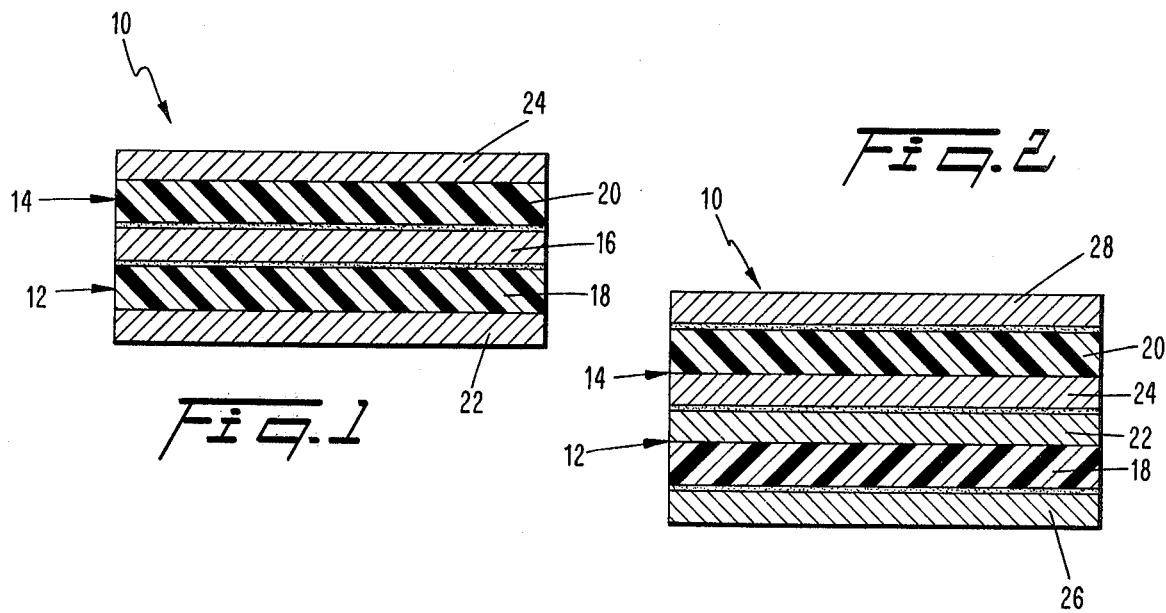
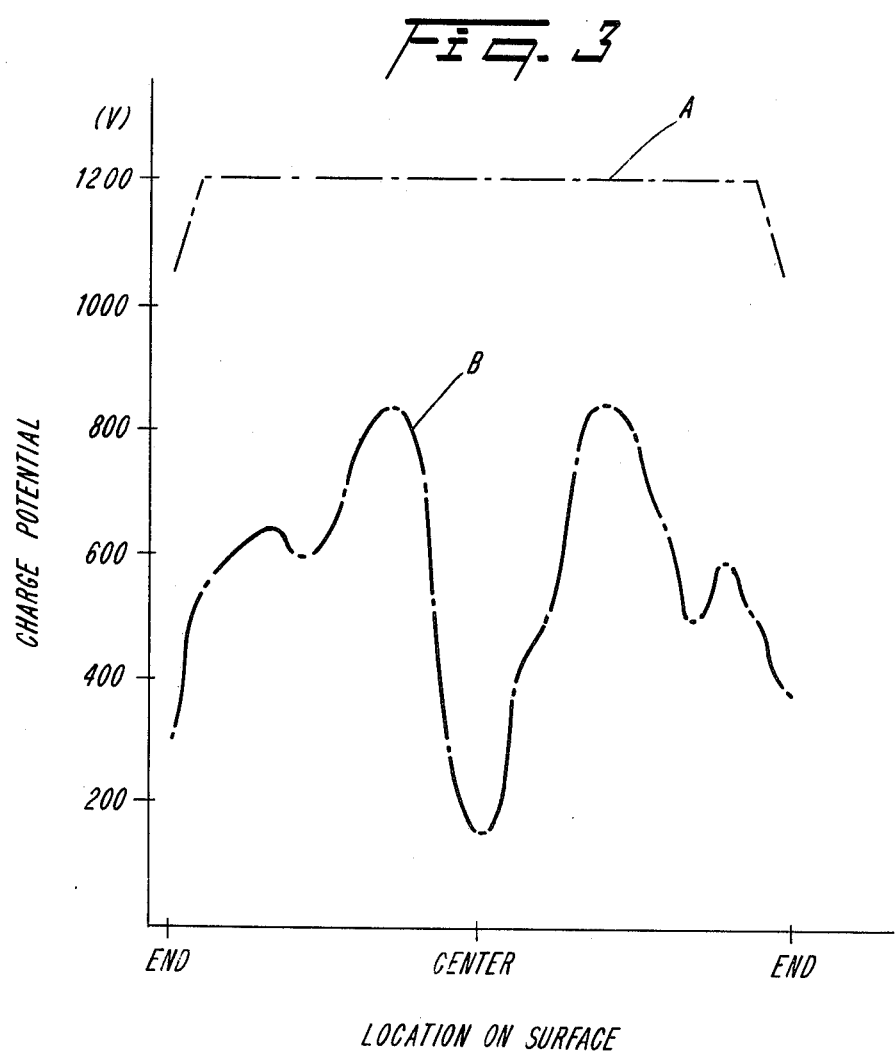

ELECTRET DEVICE

This is a continuation, of application Ser. No. 280,016, filed June 30, 1981 now abandoned.

FIELD OF THE INVENTION

This invention relates to an electret device, more particularly to an electret device having an extremely high surface charge potential.

An electret is a dielectric body having a high degree of surface electric charge. The electret retains its surface electric charge for a long period of time, often measured in tens of years. The electric charge, or dielectric polarization, is achieved, for example, in one prior art process by heating a body of dielectric material to a relatively high temperature while the material is exposed to an intense electric field for a substantial period of time, and then cooling the material while maintaining its exposure to the electric field. Upon cooling, the material exhibits characteristics of a permanent charge distribution.

Electrets have many uses as a transducer in a device such as a microphone, a loudspeaker and a record disk pick-up. Moreover, it is anticipated that electrets will be used in the near future as memory units, high potential sources, measuring apparatus and the like.

Electrets comprise dielectrics which produce static electric fields having relatively long lifetimes. Their long lifetimes are primarily attributable to the development of new materials which are more stable than previously employed wax materials. Today, plastic materials such as polyethylene, polypropylene and polyethylene terephthalate are extensively used in constructing electrets.

Conventionally, electrets are constructed in the form of devices in which an electret body is secured on a conductive electrode. Such electret devices have drawbacks, in that their surface charge potential is relatively low.

SUMMARY OF THE INVENTION

Accordingly, it is an object of the present invention to provide an electret device having a relatively high surface charge potential.

Another object of the present invention is to provide an electret device having an expanded lifetime.

A further object of the present invention is to provide an electret device having a surface charge which can be adjusted to the desired magnitude.

A still further object of the present invention is to provide an electret device having a relatively uniform surface charge distribution.

To achieve the foregoing objects in accordance with the invention, as embodied and broadly described herein, the electret device is comprised of a first electret element having a negatively polarized dielectric layer and a conductive layer, and a second electret element having a positively polarized dielectric layer and a conductive layer, said second electret element being stacked upon said first electret element with the respective dielectric layers facing each other. The invention further comprises an electret device comprising a first electret element having a negatively polarized dielectric layer and a conductive layer; a second electret element having a positively polarized dielectric layer and a conductive layer, said second electret element being stacked upon said first electret element with the respective conductive layers facing each other; and a plurality of plates, with at least one of said plates being stacked upon each of said first and second electret elements, and at least one of said plates being comprised of a conductive material.

Further objects, features and advantages of the present invention will become apparent to persons skilled in the art from a study of the following description of the accompanying drawings, in which:

BRIEF DESCRIPTION OF THE DRAWINGS

FIG. 1 is a sectional view of an electret device constructed according to the present invention.

FIG. 2 is a sectional view of another embodiment of an electret device according to the present invention.

FIG. 3 is a diagram comparing charge potential distributions on a conventional electret device and an electret device of the present invention.

DESCRIPTION OF THE PREFERRED EMBODIMENT

Figure 4:
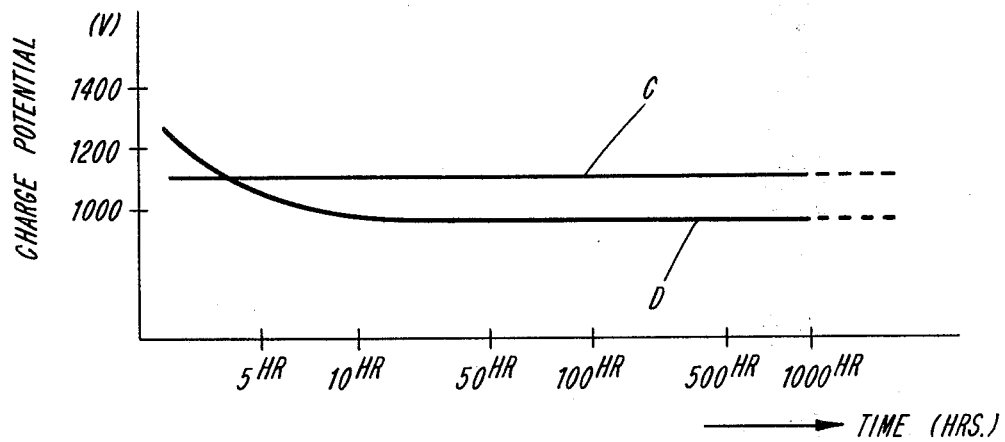
FIG. 4 is a diagram illustrating the charge retention properties of two embodiments of the electret device according to the present inventon.

The present invention will be described in detail with reference to the drawings (FIG. 1 to FIG. 5). Throughout the drawings, like reference numerals are used to designate like or equivalent portions, for the sake of clarity and simplicity of explanation.

FIG. 1 shows a sectional view of an electret device constructed according to the present invention. Electret device 10 comprises two electret elements 12 and 14 which are stacked upon each other via an intermediate plate 16. Each electret element 12, 14 has a dielectric layer 18, 20, with each layer facing intermediate plate 16, and a conductive layer 22, 24. Each dielectric layer 18, 20 is provided with a high degree, or volume, of electric charge, or polarization. That is, dielectric layers 18 and 20 are so-called electrets. However, the dielectric layers 18, 20 have opposite polarity charges. For example, if dielectric layer 18 has positive charges, the other dielectric layer (20) has negative charges. Intermediate plate 16 may be formed of any conductive, non-conductive or semi-conductive material.

In the electret device 10 shown in FIG. 1, many negative charges arise on the outer surface of electret element 14, i.e., the outer surface of conductive layer 24, as a result of the dielectric polarization of both dielectric layer 20 itself and dielectric layer 18 of the other electret element 12. Therefore, electret device 10 will have a high surface charge potential; nearly two times that of the individual electret elements 12, 14.

The charge potential $E_s$ may be assumed to be given by the following equation:

$$E_s = K \cdot (E_{14} - E_{12}) \tag{1}$$

where $E_s$ represents the charge potential of electret device 10 as a whole, $E_{14}$ and $E_{12}$ represent the average charge potentials of electret elements 14 and 12, respectively, and K represents the polarization constant, as it will be referred to herein, of the material of intermediate plate 16.

The constant K of metal is a numerical value between about 0.6 and 0.99, and the constant K of glass is around 0.83, according to our measurements.

Assuming that the charge potentials E14 and E12 are approximately equal in absolute value, and represented as E, Equation (1) may be written as follows:

$$E_s = 2 \cdot K \cdot E \qquad (2)$$

Individual electret elements 12, 14 are similar to conventional electret devices. Typically, the polarization of each dielectric layer 18, 20 is carried out by, for example, imposing an electrical field or applying charged particles, e.g., ions, before or after conductive layers 22, 24 are secured to dielectric layers 18, 20. The polarity of dielectric layers 18, 20 is determined by the polarity of the electrical field or the charged particles.

Most dielectric materials are suitable for forming dielectric layers 18, 20 in the electret of the present invention. However, high molecular weight compounds such as polypropylene, teflon ® (flourine-containing polymers) or polyethylene are especially suitable because the electric charge in these materials becomes relatively high in potential and is maintained for a long period of time.

It is apparent from Equations (1) and (2) that the charge potential $E_s$ of electret device 10 is much higher than that of the individual electret elements 12, 14. Therefore, the electret device 10 described above is very useful in many fields. For example, an electrostatic transducer in a device such as a microphone or a headphone using the electret device 10 of the present invention is highly sensitive and has other desirable properties. Specifically, powerful electrostatic loudspeakers which are difficult to realize utilizing prior art electret devices may be constructed using electret device 10.

FIG. 2 shows a sectional view of an electret device of another embodiment according to the present invention. Electret device 10, as shown in FIG. 2, comprises two electret elements 12 and 14 which are stacked upon each other. Each electret element 12, 14, is comprised of a dielectric layer 18, 20, each spaced apart from the other, and a conductive layer 22, 24, each facing the other directly. Outer plates 26 and 28 are stacked adjacent dielectric layers 18 and 20, respectively. At least one outer plate, for example, plate 26 is formed of conductive material for use as a conductive electrode of electret device 10. The remaining outer plate may be made of any conductive, non-conductive or semi-conductive material.

FIG. 3 shows a diagram comparatively illustrating the potential distribution characteristics of electret device 10 constructed according to the present invention and a conventional electret device. Graph A shows the potential distribution characteristics of an electret device 10 constructed as shown in FIG. 1 or FIG. 2, and graph B shows the potential distribution characteristics of a conventional electret device similar in its size to that of the present invention.

As may be seen from graph A, the charge potential for electret device 10 constructed according to the present invention is nearly two times that of a conventional electret device, as shown in graph B. The charge potential dispersion shown in graph A exhibits little dispersion whatsoever. As may be seen from the very flat characteristics of graph A, an electret device 10 according to the present invention exhibits an exceedingly uniform surface charge at every part of its upper surface. On the other hand, the conventional electret device does not exhibit a uniform surface charge, as may be seen from graph B.

Electret device 10 of the present invention, therefore, possesses improved usefulness. For example, transducers using electret device 10 of the present invention can provide high efficiency transducing characteristics due to the high surface charge potential of the electret device. Furthermore, transducers using electret device 10 of the present invention can provide high fidelity transducing characteristics, since the electrostatic forces arising between electret device 10, as one electrode of a transducing capacitor, and an opposing electrode are uniform at every part of the transducing capacitor.

Electret device 10 according to the present invention exhibits long lived charge or polarization retention properties, since dielectric layers 18, 20 are protected from exposure to the air, and thus the charge becomes hard to drain away from dielectric layers 18, 20. Since dielectric layers 18, 20 of electret elements 12, 14 are protected from exposure to the air by conductive layers 22 and 24 (FIG. 1) or outer plates 26 and 28 (FIG. 2), the surface charge is hard to drain away from dielectric layers 18, 20.

The charge retention properties of the electret device of the present invention are shown in FIG. 4. Graph C shows the properties of an electret device 10 constructed as shown in FIG. 2, having both outer plates 26, 28 comprised of a conductive material, e.g. a metal. On the other hand, graph D shows the properties of the electret device 10 shown in FIG. 2, having one outer plate 28 which is comprised of a non-conductive material, for example, acrylonitrile-butadien styrene (ABS) copolymer, and the other outer plate 26 comprised of a conductive material. The ccharge potential shown in graph C is maintained for a long period of time at almost the same value as at the time of its fabrication. While the charge potential shown in graph D gradually decreases after the time of its facrication, the charge potential approaches a steady state around 24 hours afterwards. Then, both of the charge potentials (C and D) remain at a steady state for a very long period of time.

The surface charge of an electret device 10 constructed as shown in FIG. 1 or FIG. 2 may be easily increased when it diminishes by merely supplying a high voltage potential between conductive layers 22 and 24 (FIG. 1) or between outer plates 26 and 28 (FIG. 2), provided they are made of a conductive material, since dielectric layers 18, 20 will be repolarized by the high voltage potential.

Figure 5:
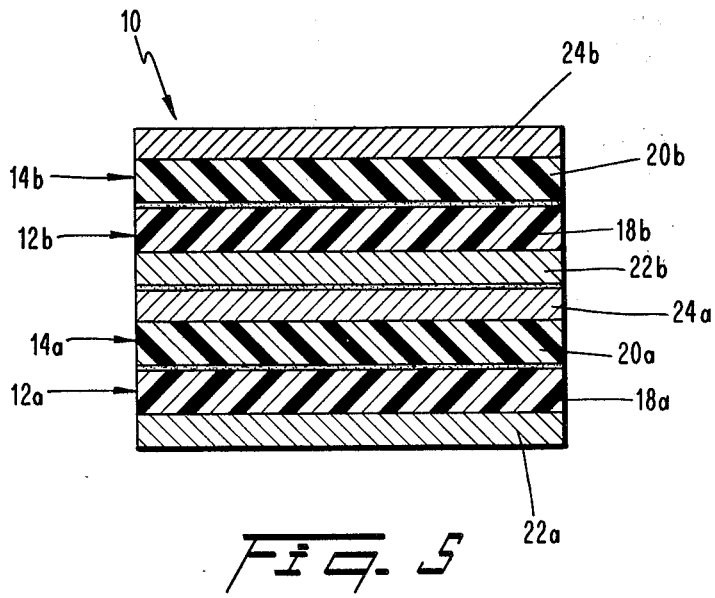
FIG. 5 is a sectional view of a modified embodiment of the electret device according to the present invention.

FIG. 5 shows a sectional view of a modified electret device according to the present invention. The electret device 10 shown in FIG. 5 comprises a plurality of electret elements, for example, four electret elements $12_a$, $14_a$, $12_b$ and $14_b$ which are stacked upon each other in turn. Electret elements $12_a$ and $12_b$ are negatively charged, while electret elements $14_a$ and $14_b$ are positively charged. Dielectric layers $18_a$ and $20_a$ of first and second electret elements $12_a$ and $14_a$, respectively, face each other. Conductive layers $24_a$ and $22_b$ of second and third electret elements $14_a$ and $12_b$, respectively, face each other. Dielectric layers $18_b$ and $20_b$ of third and fourth electret elements $12_b$ and $14_b$, respectively, face each other. Conductive layers $22_a$ and $24_b$ of first and fourth electret elements $12_a$ and $14_b$, respectively, are located at the outer ends of electret device 10.

The electret device 10 shown in FIG. 5 has a very high surface charge potential; nearly four times that of the individual electret elements.

What is claimed is:

1. An electret device comprising:
a first electret element having a negatively polarized dielectric layer and a conductive layer, and
a second electret element having a positively polarized dielectric layer and a conductive layer, said second electret element being stacked upon said first electret element with the respective dielectric layers facing each other,
wherein said electret elements each has a relatively uniform surface charge distribution approximately equal to the sum of the respective charge potentials of said electret elements, individually.

2. An electret device according to claim 1, further comprising an intermediate plate between said first and second electret elements.

3. An electret device according to claim 2, wherein said intermediate plate is made of conductive material.

4. An electret device according to claim 2, where said intermediate plate is made of non-conductive material.

5. An electret device according to claim 2, wherein said intermediate plate is made of semi-conductive material.

6. An electret device as claimed in claim 1, further comprising:
a third electret element having a negatively polarized dielectric layer and a conductive layer, and
a fourth electret element having a positively polarized dielectric layer and a conductive layer, said fourth electret element being stacked upon said third electret element with their respective dielectric layers facing each other,
wherein the first, second, third and fourth electret elements are stacked upon each other in layers, with the respective conductive layers of the second and third electret elements facing each other,
wherein said third and fourth electret elements each has a relatively uniform surface charge distribution approximately equal to the sum of the respective charge potentials of said third and fourth electret elements, individually.

7. An electret device comprising:
a first electret element having a negatively polarized dielectric layer and a conductive layer;
a second electret element having a positively polarized dielectric layer and a conductive layer, said second electret element being stacked upon said first electret element with the respective conductive layers facing each other; and
first and second plates stacked upon the outer faces of the dielectric layers of said first and second electret elements, respectively, at least one of said plates being comprised of a conductive material,
wherein said electret elements each has a relatively uniform surface charge distribution approximately equal to the sum of the respective charge potentials of said electret elements, individually.

* * * * *